United States Patent
Shiah et al.

(10) Patent No.: US 7,515,669 B2
(45) Date of Patent: Apr. 7, 2009

(54) DYNAMIC INPUT SETUP/HOLD TIME IMPROVEMENT ARCHITECTURE

(75) Inventors: Chun Shiah, Hsinchu (TW); Bor-Doou Rong, Chupei (TW); Shi-Huei Liu, Jhubei (TW)

(73) Assignee: Etron Technology, Inc., Hsin-Chu (TW)

( * ) Notice: Subject to any disclaimer, the term of this patent is extended or adjusted under 35 U.S.C. 154(b) by 626 days.

(21) Appl. No.: 11/227,847

(22) Filed: Sep. 15, 2005

(65) Prior Publication Data

US 2007/0058765 A1    Mar. 15, 2007

(51) Int. Cl.
*H04L 7/00* (2006.01)
(52) U.S. Cl. .......................... 375/355; 326/81; 326/82; 326/83; 327/108; 327/175; 327/276; 327/263
(58) Field of Classification Search .................. 327/108, 327/175, 276, 263; 326/81, 82, 83; 379/27.08; 375/355
See application file for complete search history.

(56) References Cited

U.S. PATENT DOCUMENTS

| | | | |
|---|---|---|---|
| 4,320,260 A * | 3/1982 | Lechner | 379/27.08 |
| 4,618,788 A | 10/1986 | Backes et al. | |
| 5,506,534 A | 4/1996 | Guo et al. | |
| 6,411,150 B1 | 6/2002 | Williams | |
| 6,650,190 B2 | 11/2003 | Jordan et al. | |
| 7,102,407 B2 * | 9/2006 | Slawecki | 327/263 |
| 7,151,397 B2 * | 12/2006 | Andrasic et al. | 327/276 |
| 7,202,699 B1 * | 4/2007 | Feighery | 326/81 |
| 7,362,144 B2 * | 4/2008 | Shiah | 327/108 |
| 2008/0036517 A1 * | 2/2008 | Huang et al. | 327/175 |

* cited by examiner

*Primary Examiner*—Sudhanshu C Pathak
(74) *Attorney, Agent, or Firm*—Saile Ackerman LLC; Stephen B. Ackerman; Larry J. Prescott

(57) ABSTRACT

A new method to sample a digital input signal is achieved. The method comprises sampling a digital input processed through a first digital buffer. The sampling is at the rising edge of a system clock. The switching threshold of a second digital buffer is updated. The digital input processed through the second digital buffer is sampled. The sampling is at the falling edge of the system clock. The switching threshold of the first digital buffer is updated. A digital sampling circuit is achieved.

23 Claims, 8 Drawing Sheets

DYNAMIC INPUT SETUP/HOLD TIME IMPROVEMENT ARCHITECTURE

BACKGROUND OF THE INVENTION (1) Field of the Invention

The invention relates to a digital circuit, and, more particularly, to a data sampling circuit having dynamically adjustable setup/hold times.

(2) Description of the Prior Art

Data sampling circuits are widely used in the art of digital circuits. In a data sampling circuit, the state (high or low) of a data signal is captured at a periodic time point coincident with a clocking signal. Referring now to FIG. 1, an exemplary data sampling circuit 10 is illustrated in schematic form. In the circuit 10 an input signal DATA 14 is processed through two signal paths, DATAPATH1 and DATAPATH2. DATAPATH1 includes two inverter buffers 42 and 46 that generate the internal signal data1 26. DATAPATH2 includes two inverter buffers 54 and 58 that generate the internal signal data2 30. Inverter buffers are used so that the input signal DATA 14 need only drive the capacitive load of the first inverter buffers 42 and 54 and the short line routings from the DATA 14 input to those buffers. Registers REG1 50 and REG2 62 are used to periodically sample data1 26 and data2 30 based on the system clock CLK 66. REG1 50 samples data1 26 at the rising edge of CLK 66 to generate the sampled output DATA_OUT1 34. By contrast, REG2 62 samples data2 30 at the falling edge of CLK 66 to generate the sampled output DATA_OUT2 38.

The timing performance of the sampling circuit 10 is also shown. The data1 signal 26 and the data2 signal 30 follow the DATA input 14. DATA_OUT1 34 and DATA_OUT2 38 follow data1 26 and data2 30, respectively. However, the DATA_OUT1 signal 34 changes on the rising edges of the system clock CLK 66, while the DATA_OUT2 signal 38 changes on the falling edges of the system clock CLK 66. Several key timing specifications 70, 72, 74, and 78 are noted. For the DATA signal 14 to be properly sampled by the sampling registers REG1 50 and REG2 62, the signal state 14 must be constant for a window of time around the sampling edge of the clock CLK 66. This sampling window is commonly defined as the setup and hold window for the signal. That is, the DATA 14 state must be setup a certain time before the sampling edge of CLK 66 and must be held a certain time after the sampling edge of CLK 66 to be certain that the state is sampled correctly. In this case, the data setup time at a rising edge, $t_{sr}$ 70, and the data hold time at a rising edge of the clock, $t_{hr}$ 74, are critical parameters for generating DATA_OUT1 from DATA 14 via rising edge sampling. Likewise, the data setup time at a falling edge, $t_{sf}$ 72, and the data hold time at a falling edge of the clock, $t_{hf}$ 78, are critical parameters for generating DATA_OUT2 from DATA 14 via falling edge sampling.

In most cases, the DATA signal 14 is not perfectly synchronized with the system clock CLK 66. As a result, the timing locations of edge transitions for DATA 14 can occur at very close to the sampling edges (rising or falling) of CLK 66. As a result, the specified setup and hold times 70, 72, 74, and 78 may be violated and may further result in data mis-sampling. It should be noted that the inverting buffers 42, 46, 54, and 58 create fixed delays between DATA and either DATA1 26 and DATA2 30. Therefore, any assistance in meeting a setup/hold timing that is derived from the inverting buffers 42, 46, 54, and 58, such as holding a signal state longer for a sampling edge, is lost if the relative position of the DATA 14 edges with respect to CLK 66 changes. A method to dynamically adjust the setup and hold timings of the digital sampling circuit is therefore a key objective of the present invention.

Several prior art inventions relate to input buffers and to data paths. U.S. Pat. No. 6,411,150 to Williams teaches an input buffer having a dynamically controlled switching threshold. A register is used to store a programmed state for the input buffer. Switches in the buffer circuit control the switching threshold. These switches are activated or de-activated based on the register state. U.S. Pat. No. 5,506,534 to Guo et al shows a delay circuit with an adjustable delay. MOS transistors, operating as large value resistors, are turned ON or OFF to adjust the delay. U.S. Pat. No. 6,650,190 to Jordon et al shows a ring oscillator circuit having adjustable delay elements. A fine boost control signal is provided to each delay cell to adjust the delay via the gate voltage on MOS load devices. U.S. Pat. No. 4,618,788 to Backes et al teaches an adjustable delay circuit for an integrated circuit device.

SUMMARY OF THE INVENTION

A principal object of the present invention is to provide an effective digital sampling circuit.

A further object of the present invention is to provide a method to improve digital sampling performance.

A yet further object of the present invention is to provide a method to dynamically adjust inverter buffer switching thresholds to thereby improve setup and hold performance of a digital sampling circuit.

A yet further object of the present invention is to provide a method to optimize setup and hold performance for a digital signal.

A yet further object of the present invention is to provide a digital sampling circuit with dynamically adjusted setup and hold times.

A yet further object of the present invention is to provide a circuit where setup and hold times are optimized by feeding back sampled data to dynamically adjust inverter buffer switching thresholds.

In accordance with the objects of this invention, a method to sample a digital input signal is achieved. The method comprises sampling a digital input processed through a first digital buffer. The sampling is at the rising edge of a system clock. The switching threshold of a second digital buffer is updated. The digital input processed through the second digital buffer is sampled. The sampling is at the falling edge of the system clock. The switching threshold of the first digital buffer is updated.

Also in accordance with the objects of this invention, a digital sampling device is achieved. The device comprises a first digital buffer having an input and an output and comprising a plurality of series connected, digital inverters each having an adjustable switching threshold. A first sampling register is used to generate a first sample of the first digital buffer output at rising edges of a system clock. A second digital buffer has an input and an output and comprising a plurality of series connected, digital inverters each having an adjustable switching threshold. The first and second digital buffer inputs are the same signal. A second sampling register is used to generate a second sample of the second digital buffer output at falling edges of a system clock. The first digital buffer switching threshold is adjusted based on the second sample. The second digital buffer switching threshold is adjusted based on the first sample.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method to improve the performance of a digital sampling circuit. A sampling circuit with a feedback mechanism to dynamically adjust setup/hold times is disclosed. An inverter buffer with dynamically adjustable switching threshold is disclosed. It should be clear to those experienced in the art that the present invention can be applied and extended without deviating from the scope of the present invention.

Figure 2:
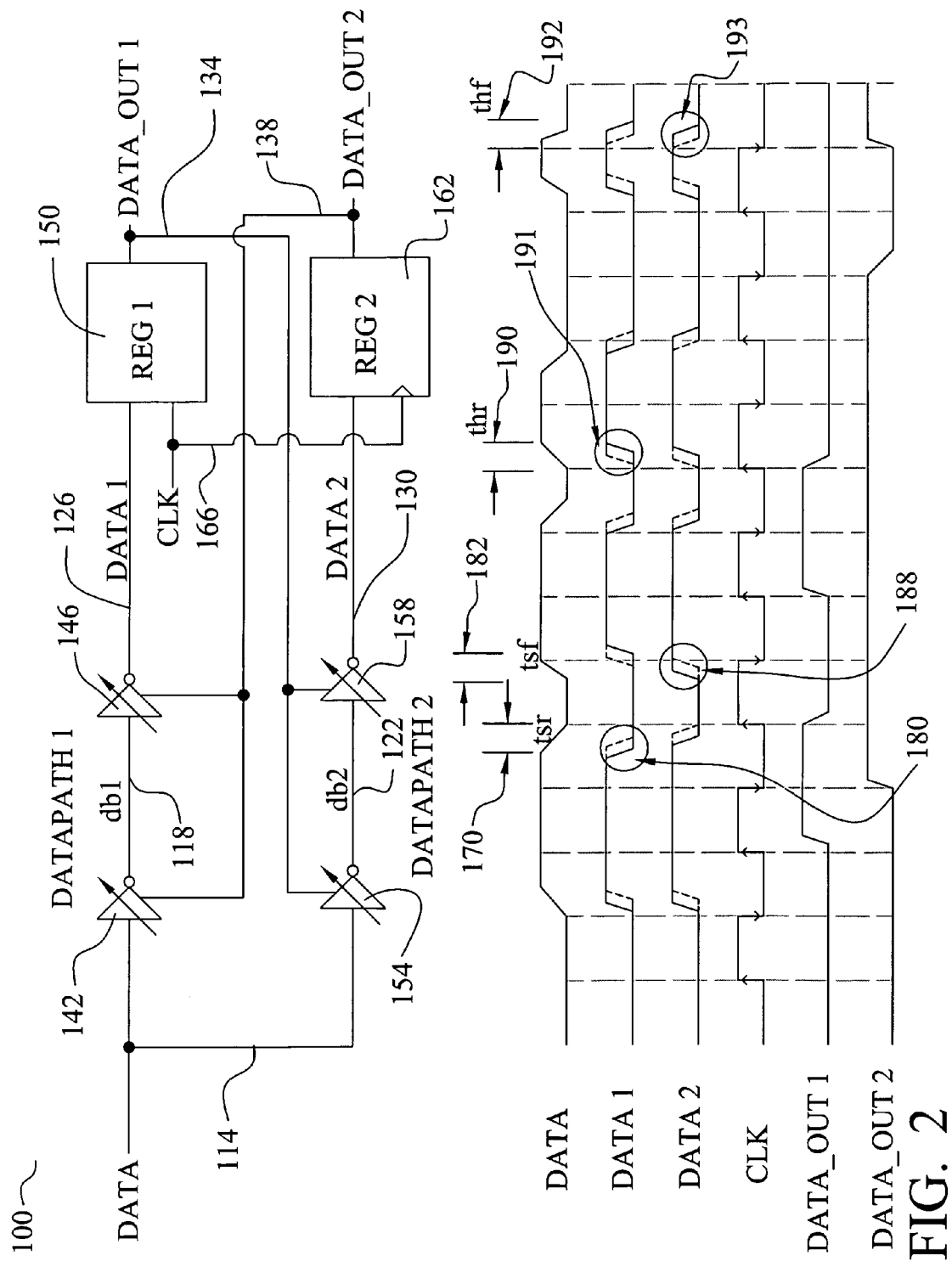
FIG. 2 illustrates a first preferred embodiment of the present invention showing a data path architecture for sampling a digital data signal.

Referring now to FIG. 2, a first preferred embodiment of the present invention is illustrated. Several important features of the present invention are shown and discussed below. A data sampling circuit 100 is shown in schematic form. The timing performance of the circuit 100 is also shown in timing diagram form. The data sampling circuit 100 comprises two data paths, DATAPATH1 and DATAPATH2 for buffering the DATA signal 114. Registers REG1 150 and REG2 162 are used to sample the DATA signal 114 on the rising edge and on the falling edge, respectively, of the system clock CLK 166. The circuit 100 comprises several key features that are unique to the present invention and that provide significant advantages over the prior art. First, the inverter buffers 142 and 146 of DATAPATH1 and the inverter buffers 154, and 148 of DATAPATH2 have adjustable switching thresholds as is signified by the arrows crossing the inverter symbols. Second, the sampled data values, DATA_OUT1 134 and DATA_OUT2 138 are used to control the switching threshold adjusting mechanism of the inverter buffers 142, 146, 154, and 158. Third, the rising edge sampled output DATA_OUT1 134 is fed back to the data path DATAPATH2 that generates the falling edge sampled input data2 130, and the falling edge sampled output DATA_OUT2 138 is fed back to the data path DATAPATH1 that generates the rising edge sampled input data1 126.

The circuit 100 comprises a first digital buffer 142 and 146 having an input connected to the DATA input 114 and an output comprising data1 126. The first digital buffer comprises a plurality of series connected, digital inverters. In this case, two digital inverters 142 and 146 are used. Each digital inverter 142 and 146 has an adjustable switching threshold. A first sampling register REG1 150 is used to generate a first sample DATA_OUT1 134 of the first digital buffer output data1 126 at rising edges of the system clock CLK 166. A second digital buffer 154 and 158 has an input DATA 114 and an output data2 130 and comprises a plurality of series connected, digital inverters 154 and 158 each having an adjustable switching threshold. The first and second digital buffer inputs are the same signal, that is, DATA 114. A second sampling register REG2 162 is used to generate a second sample DATA_OUT2 138 of the second digital buffer output data2 130 at falling edges of the system clock CLK 166. The first digital buffer 142 and 146 switching threshold is adjusted based on the second sample DATA_OUT2 138. The second digital buffer 154 and 158 switching threshold is adjusted based on the first sample DATA_OUT1 134. The registers REG1 150 and REG2 162 preferably comprise data flip-flops, or DFF.

In the present invention, the inverter buffers 142, 146, 154, and 158 operate in two states: low switching threshold and high switching threshold. The switching threshold of an inverter buffer is defined as the dc voltage at which the inverter output transitions from a high to a low or from a low to a high. At input voltages well below the switching threshold, the inverter output is driven by a PMOS transistor to the upper voltage supply (VCC). At input voltages well above the switching threshold, the inverter output is driven by an NMOS transistor to the lower voltage supply (VSS). At the exact switching threshold voltage, the output of the inverter is midway between the VCC and the VSS voltages.

In the prior art, the switching threshold of an inverter buffer is a fixed characteristic of that inverter buffer and depends on the relative sizes of the NMOS and PMOS transistors. If, for example, both transistors are formed with minimum gate lengths, as set by the minimum-width of the polysilicon line crossing the transistor active area, then the switching threshold is established by the relative widths of the transistors. Depending on the CMOS technology, the relative transconductance of the NMOS and PMOS transistors may be different. However, if each type of transistor performs in similar, though opposite, manner, then the switching threshold of the inverter is set to a mid-supply value of:

$$V_{SWTH}=(VCC-VSS)/2$$

if the NMOS and PMOS transistors have equal widths.

Figure 1:
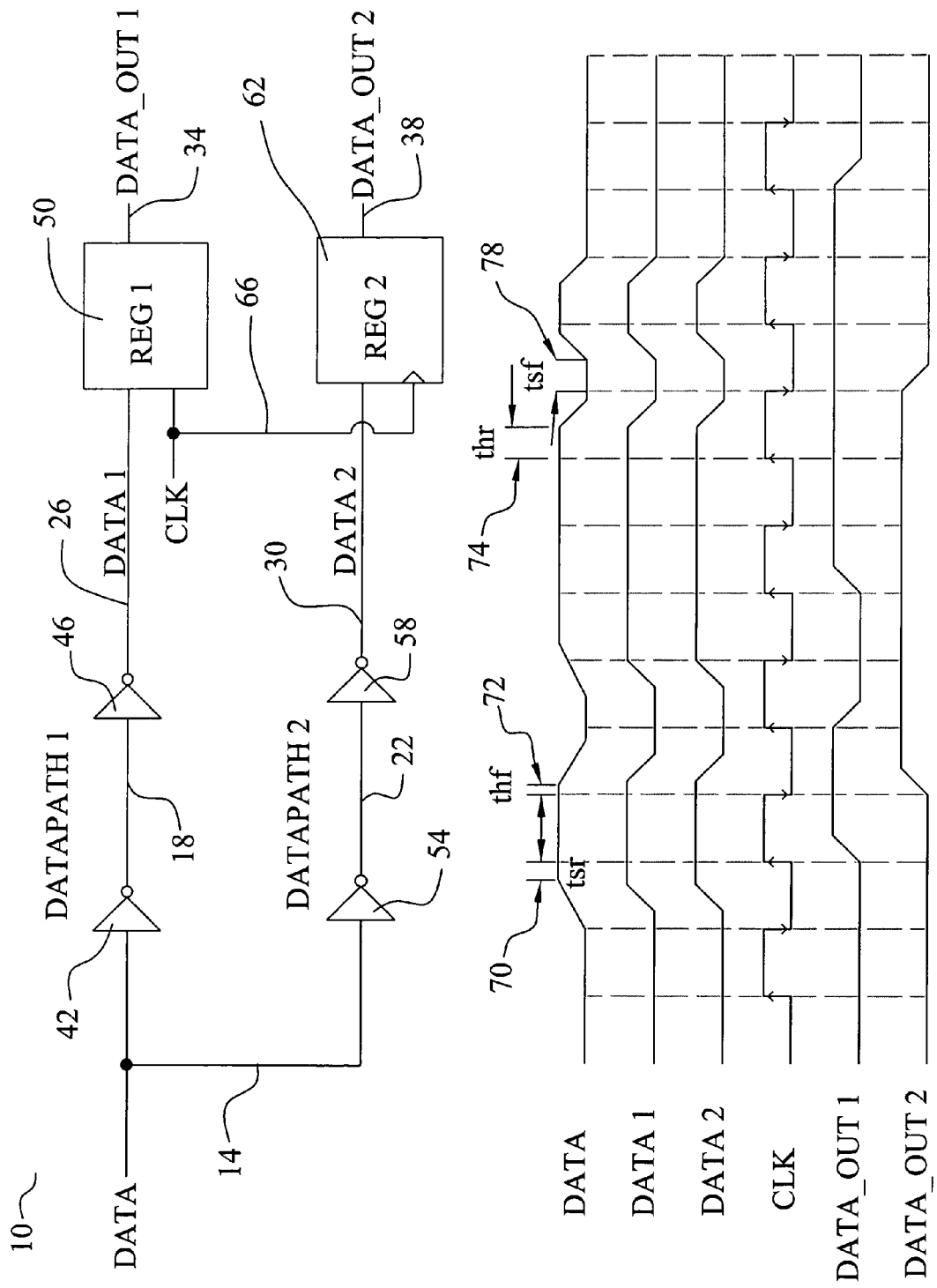
FIG. 1 illustrates a prior art data path for sampling a digital data signal.
Figure 4:
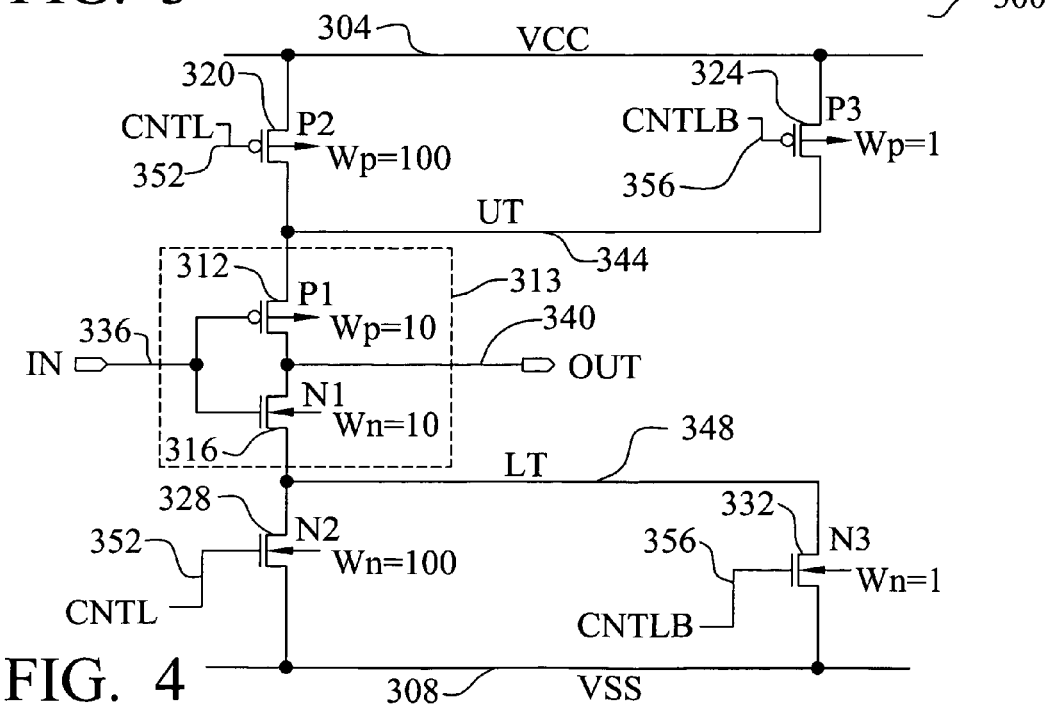
FIG. 4 illustrates third preferred embodiment of the present invention showing an inverter buffer with an adjustable switching threshold.

In the prior art, the switching threshold $V_{SWTH}$ of the inverter buffer is a static value, such as in the case of the inverter buffers 42, 46, 54, and 58 of FIG. 1. In the present invention shown in FIG. 2, however, the switching thresholds of the inverter buffers 142, 146, 154, and 158 are not fixed. Rather, these switching thresholds are dynamically controlled. The inverter buffer thresholds in the present invention circuit 100 are dynamically changed by altering the effective width of the NMOS and PMOS devices in the inverter chain within each inverter buffer. The structure of the novel inverter buffer capable of threshold adjustment is shown in FIG. 4 and will be explained in a later part of this description.

As described above, the digital sampling circuit 100 feeds back the sampled outputs DATA_OUT1 134 and DATA_OUT2 138 to the input data paths DATAPATH1 and DATAPATH2 to control the switching thresholds of the inverter buffers 142, 146, 154, and 158. The control scheme for adjusting the data path switching thresholds depending on the sample data is shown in TABLE 1 below.

TABLE 1

| Data path switching thresholds vs. sample data | |
|---|---|
| DATA_OUT1 = 0 | DATAPATH2 $V_{SWTH}$ = LOW |
| DATA_OUT1 = 1 | DATAPATH2 $V_{SWTH}$ = HIGH |

TABLE 1-continued

Data path switching thresholds vs. sample data

| DATA_OUT2 = 0 | DATAPATH1 $V_{SWTH}$ = LOW |
|---|---|
| DATA_OUT2 = 1 | DATAPATH1 $V_{SWTH}$ = HIGH |

Using the rules established in TABLE 1, the present invention provides feed back control of the inverter buffer switching thresholds in such a way as to increase the setup and hold capability of the circuit 100.

The resulting timing performance of the present invention is illustrated in FIG. 2. The DATA input 114 is shown as it transitions between low and high states during a segment of time. The system clock CLK 166 is shown as a periodic signal with a relationship to the DATA signal 166 that is synchronized but skewed. The data1 signal 126 and the data2 signal 130 each represent a buffered version of the DATA signal 114. However, in the present invention, the buffered signals 126 and 130 differ substantially one from another due to the dynamic switching thresholds.

The timing diagram is exemplary of performance of the circuit 100 and will be described below. First, the DATA signal 114 is operating at a low state and has been in this state for a substantial time. As a result, both DATA_OUT1 134 and DATA_OUT2 138 are in the zero state. Using the rule of TABLE 1, this means that the buffer for DATAPATH1 is biased to a LOW switching threshold. Note that each data path in the preferred embodiment has two inverter buffers. To effect a LOW switching threshold for DATAPATH1, for example, the switching threshold of the first inverter buffer 142 is made LOW and the switching threshold of the second inverter buffer 146 is made HIGH. In similar fashion, the buffer for DATAPATH2 is biased for a LOW switching threshold wherein the switching threshold of the first inverter buffer 154 is made LOW and the switching threshold of the second inverter buffer 158 is made HIGH.

The DATA signal 114 then transitions from low to high. As a result, the data1 126 and data2 130 signals also transition from low to high. However, because $V_{SWTH}$ is LOW, data1 126 and data2 130 transition more quickly than would be the case if $V_{SWTH}$ was at a static, mid-supply state. Graphically, the performance of the data1 126 and data2 130 signals with static $V_{SWTH}$ is shown by the dashed lines while the actual performance, due to the dynamically adjusted $V_{SWTH}$, is shown by the solid lines. It can be seen that the effect of the switching threshold adjustment at the first transition is to cause the DATA 114 input, at the registers REG1 150 and REG2 162, to appear to change to the high state sooner. Another way of describing this effect is to declare that the prior state (low) has been shortened or that the new state (high) has been lengthened with respect the system clock CLK 166. By lengthening or shortening the prior or new states of the input data with respect to CLK 166, the present invention can effectively increase the setup and hold capability of the circuit 100. This effect is illustrated at the subsequent transitions of the DATA input 114.

At the next transition, DATA 114 changes from high to low. At this transition, DATA_OUT1 134 and DATA_OUT2 138 are each in the high state so that the $V_{SWTH}$ for each of the data paths is biased HIGH. As a result, data1 126 transitions from high to low more quickly at the transition marked 180 than it would if the $V_{SWTH}$ was at mid-supply. Note that the DATA input 114 transition that causes the data1 transition 180 occurs very near the next rising edge of CLK 166. Without the dynamic adjustment of $V_{SWTH}$, the rising edge data setup time $t_{sr}$ would have been violated. With the dynamic adjustment of $V_{SWTH}$, the $t_{sr}$ 170 is achieved.

At the next transition, DATA 114 changes from low to high causing data2 130 to transition from low to high at the point marked by 188. Prior to the transition, DATA_OUT1 is low state so that $V_{SWTH}$ for DATAPATH2 is LOW. As a result, data2 130 transitions from low to high more quickly. In this case, the DATA 114 transition occurred very near the falling edge of CLK 166. Without the dynamic adjustment of $V_{SWTH}$, the falling edge data setup time $t_{sf}$ would have been violated. With the dynamic adjustment of $V_{SWTH}$, the $t_{sf}$ 182 is achieved.

At marker 191, DATA 114 transitions to high after a brief low pulse. DATA_OUT2 is high state so that $V_{SWTH}$ is HIGH. As a result, the edge transition for data1 126 shown at marker 191 is delayed. The data hold time for a rising edge $t_{hr}$ 190 is thereby achieved where it would have been too short with a static threshold. At marker 193, DATA 114 transitions to low after a brief high pulse. DATA_OUT1 is low state so that $V_{SWTH}$ is LOW. As a result, the edge transition for data2 130 shown at marker 193 is delayed. The data hold time for a falling edge $t_{hf}$ 192 is thereby achieved where it would have been too short with a static threshold.

Figure 3:
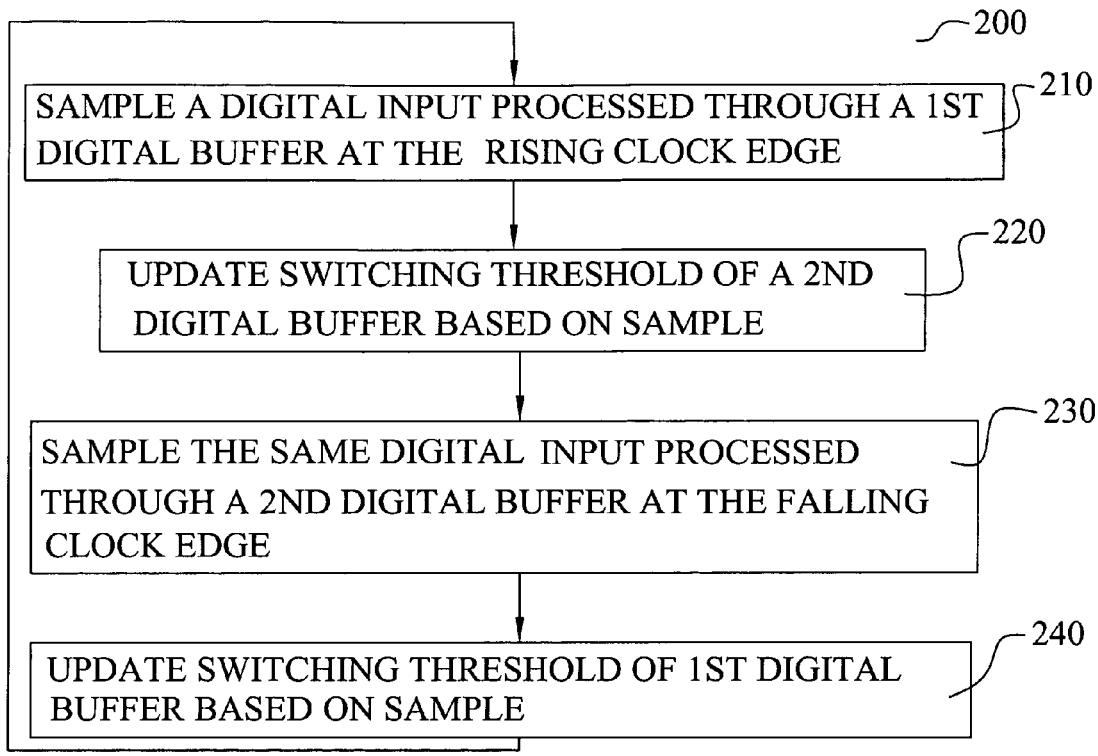
FIG. 3 illustrates a second preferred embodiment of the present invention showing a method for sampling a digital data signal.

Referring now to FIG. 3, a second preferred embodiment of the present invention is shown. The second preferred embodiment shows the generic method of digitally sampling as taught by the present invention. First, a digital input that has been processed through a first digital buffer is sampled at the rising edge of the system clock in step 210. Second, the switching threshold of a second digital buffer is updated based on the sample through the first digital buffer in step 220. Third, the same digital input that has been processed through the second digital buffer is sampled at the falling edge of the system clock in step 230. Fourth, the switching threshold of the first digital buffer is updated based on the sample through the second digital buffer in step 240. This process is repeated such that the digital buffer switching thresholds are constantly updated based on the last sample of the opposite signal path.

Figure 7A:
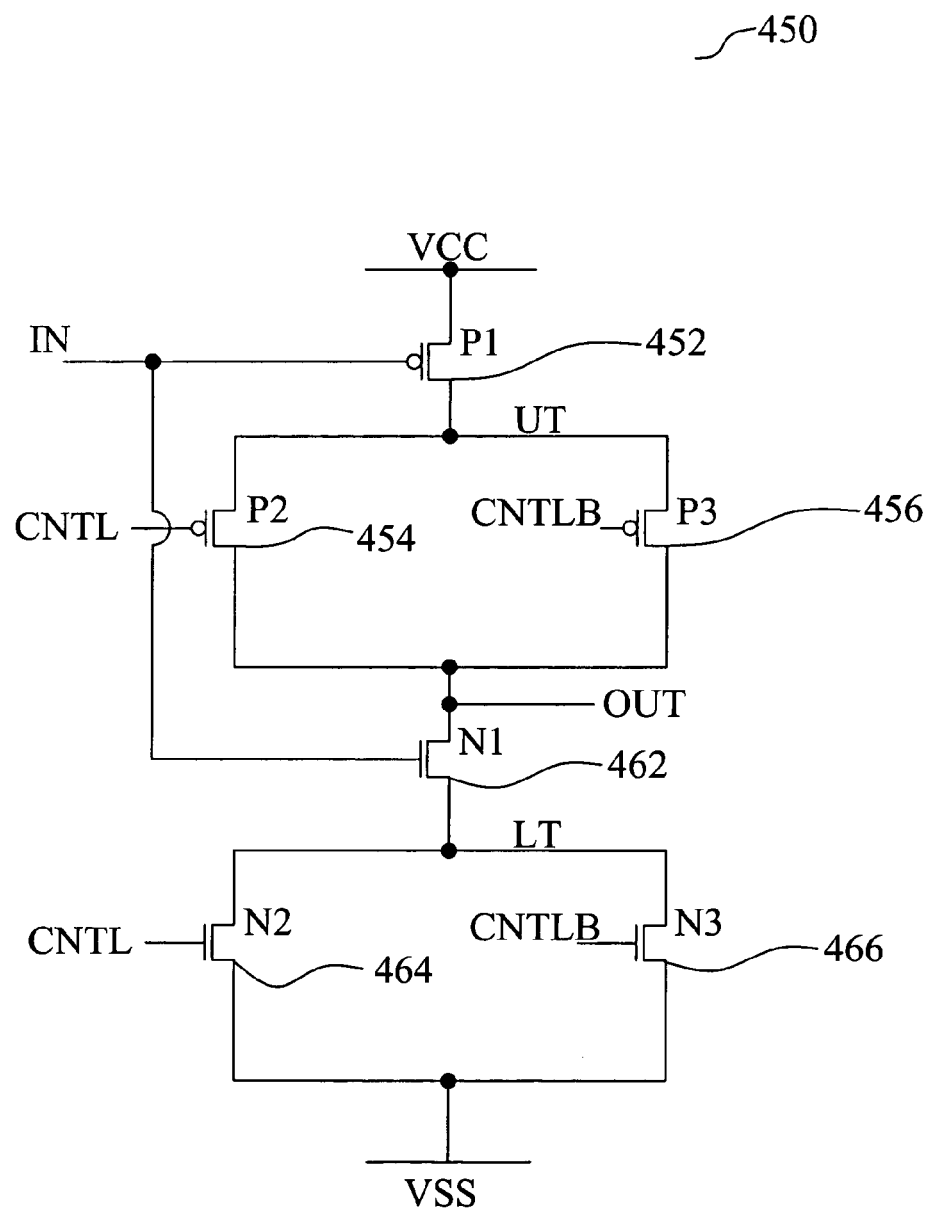
FIGS. 7a, 7b, and 7c illustrate fourth, fifth, and sixth preferred embodiments of the present invention showing alternative implementations of inverting buffers with adjustable switching thresholds.
Figure 7B:
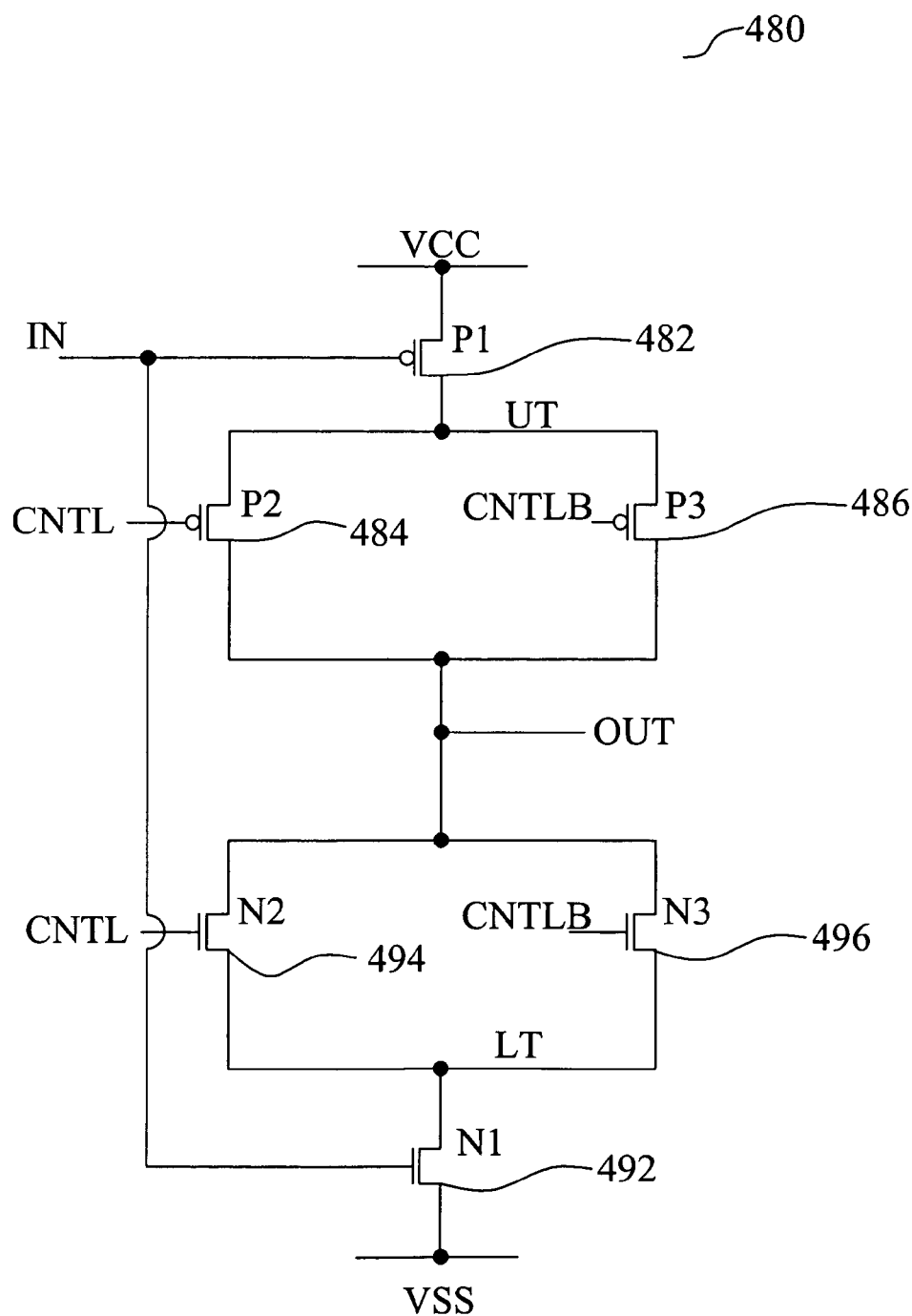
Figure 7C:
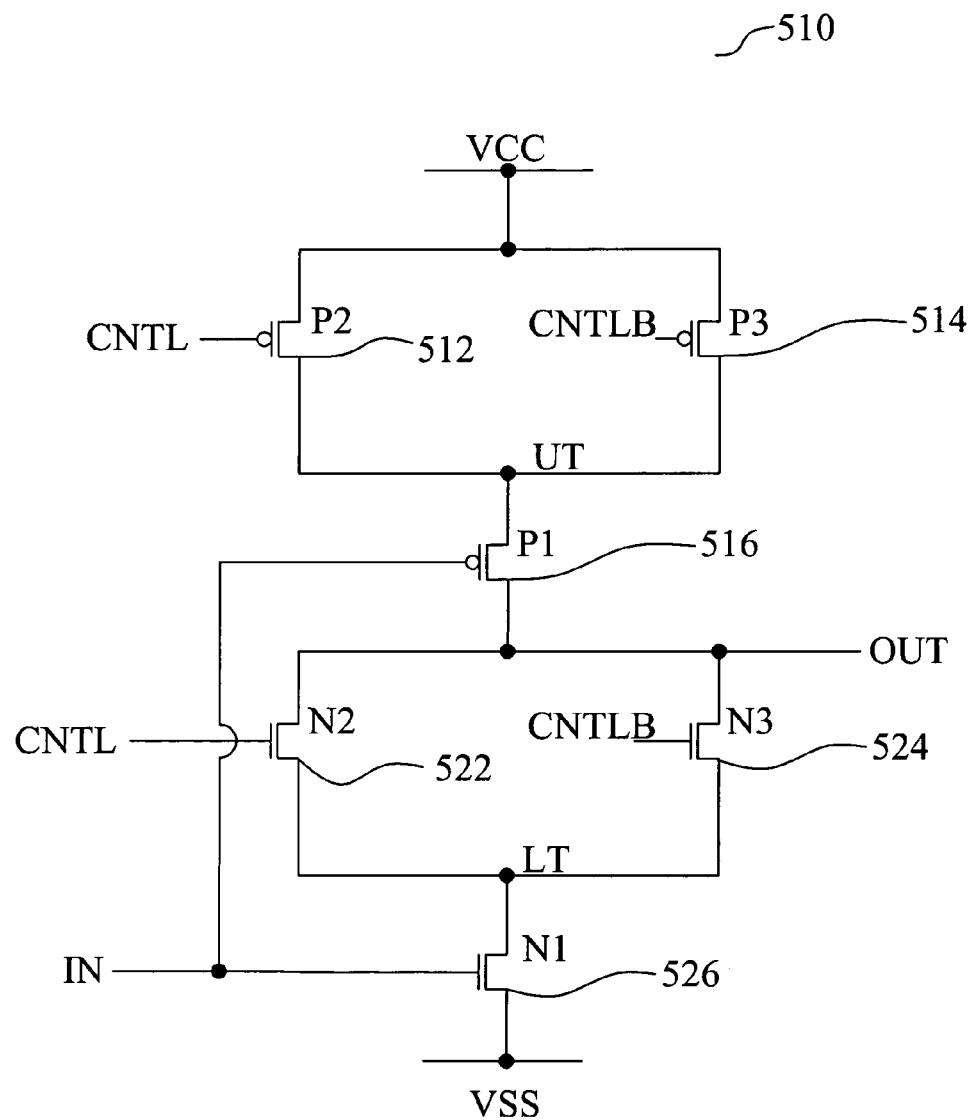

Referring now to FIG. 4, a third preferred embodiment of the present invention is illustrated. One preferred embodiment of the inverter buffer 300 of the present invention is shown. Additional preferred embodiments of an inverter buffer are illustrated in FIGS. 7A, 7B, and 7C. Referring again to FIG. 4, the inverter buffer 300 preferably comprises a CMOS inverter 312 and 316 having an upper supply terminal UT 344 and a lower supply terminal LT 348. Here, the CMOS inverter 313 comprises an n-channel transistor N1 316 and a p-channel transistor P1 312 with drains tied together to form the output OUT 340 and gates tied together to form the input IN 336. The source of the p-channel transistor 312 is the upper supply terminal UT 344 for the inverter. The source of the n-channel transistor 316 is the lower supply terminal LT 348 for the inverter. First and second p-channel transistors, P2 320 and P3 324, each switchably connect the CMOS inverter upper supply terminal UT 344 with an upper supply voltage VCC 304. First and second n-channel transistors, N2 328 and N3 332, each switchably connect the CMOS inverter lower supply terminal LT 348 with a lower supply voltage VSS 308. The gates of the first n-channel transistor N2 328 and the first p-channel transistor P2 320 are each connected to the same control signal CNTL 352. The gates of the second n-channel transistor N3 332 and the second p-channel transistor P3 324 are each connected to the same control signal CNTLB 356.

It should be noted that the first p-channel transistor P2 320 is substantially wider than the second p-channel transistor P3 324. Similarly, the first n-channel transistor N2 328 is substantially wider than the second n-channel transistor N3 332. In the preferred case, the first n-channel and p-channel transistors N2 and P2 are about 100 times wider than the second n-channel and p-channel transistors N3 and P3. More preferably, the N2 and P2 are about ten times wider than N1 and P1, while N1 and P1 are about ten times wider than N3 and P3. These ratios will depend upon the design of the n-channel and p-channel transistors and performance characteristics of the devices as is known in the art. In addition, the control signals CNTL 352 and CNTLB 356 are dependent on each other under the relationship that CNTL is always the opposite of CNTLB. Because of this constraint, at any given time, either CNTL is high (VCC) and CNTLB is low (VSS) or CNTL is low (VSS) and CNTLB is high (VCC). Finally, in the present invention, the CNTL and CNTLB signals are connected to any of the signals DATA_OUT1, DATA_OUT1B, DATA_OUT2, or DATA_OUT2B depending on the placement of the inverter buffer in the sampling circuit. This feature is shown in detail in FIG. 6.

Referring now to FIGS. 7A, 7B, and 7C, fourth, fifth, and sixth preferred embodiments are illustrated showing alternative architectures of the inverting buffer having adjustable switching threshold. In the embodiment of FIG. 4, the inverter 313 is placed between the p-channel devices P2 320 and P3 324 and the n-channel devices N2 328 and 332. However, in the embodiment 450 of FIG. 7A, the inverting transistor pair P1 452 and N1 462 are separated. The variable length p-channel transistors P2 454 and P3 456 are placed between P1 452 and N1 462. The variable length n-channel transistors N2 464 and N3 466 are placed below N1 462. Referring again to FIG. 7B, in the fifth preferred embodiment 480, the inverting pair P1 482 and N1 492 are separated by both the p-channel variable length pair P2 484 and P3 486 and the n-channel variable length pair N2 494 and N3 496. Referring again to FIG. 7C, in the sixth preferred embodiment 510, the inverting pair P1 516 and N1 526 are separated by the n-channel variable length pair N2 522 and N3 524. The p-channel variable length pair P2 512 and P3 514 are placed above P1 516.

Figure 5A:
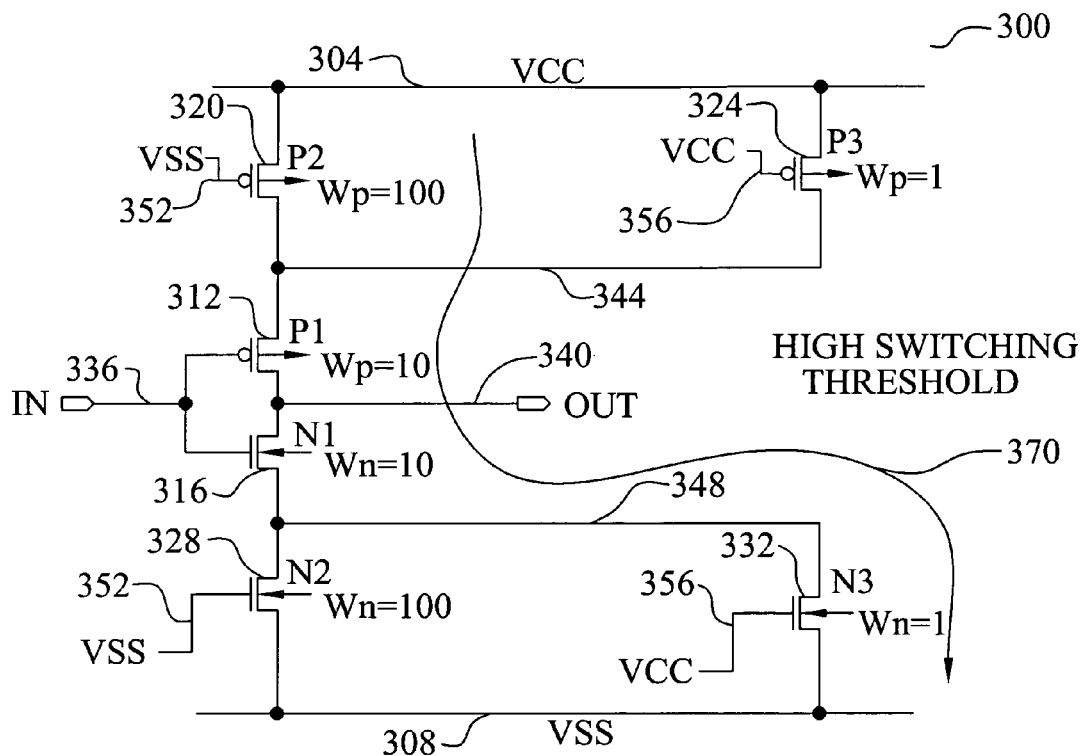
FIGS. 5A and 5B illustrate the adjustable switching threshold function of the inverter buffer of the present invention.

Referring now to FIGS. 5A and 5A, the switching threshold performance of the novel inverter buffer is illustrated. Referring in particular to FIG. 5A, the case where CNTL 352 is low (VSS) and CNTLB 356 is high (VCC) is shown. This condition causes the first p-channel transistor P2 320 to be ON, the second p-channel transistor P3 324 to be OFF, the first n-channel transistor N2 328 to be OFF, and the second n-channel transistor N3 332 to be ON. As a result, current flows 370 from VCC 304 through P2 320, through the inverter P1 312 and N1 316, and through N3 332 to VSS 308. The effective transistor width of the p-channel transistors P1 312 and P2 320 is 10. The effective transistor width of the n-channel transistors N1 316 and N3 332 is 1. Therefore, the inverter buffer is effectively unbalanced towards the p-channel devices. The resulting switching threshold is HIGH or above the mid-supply.

Figure 5B:
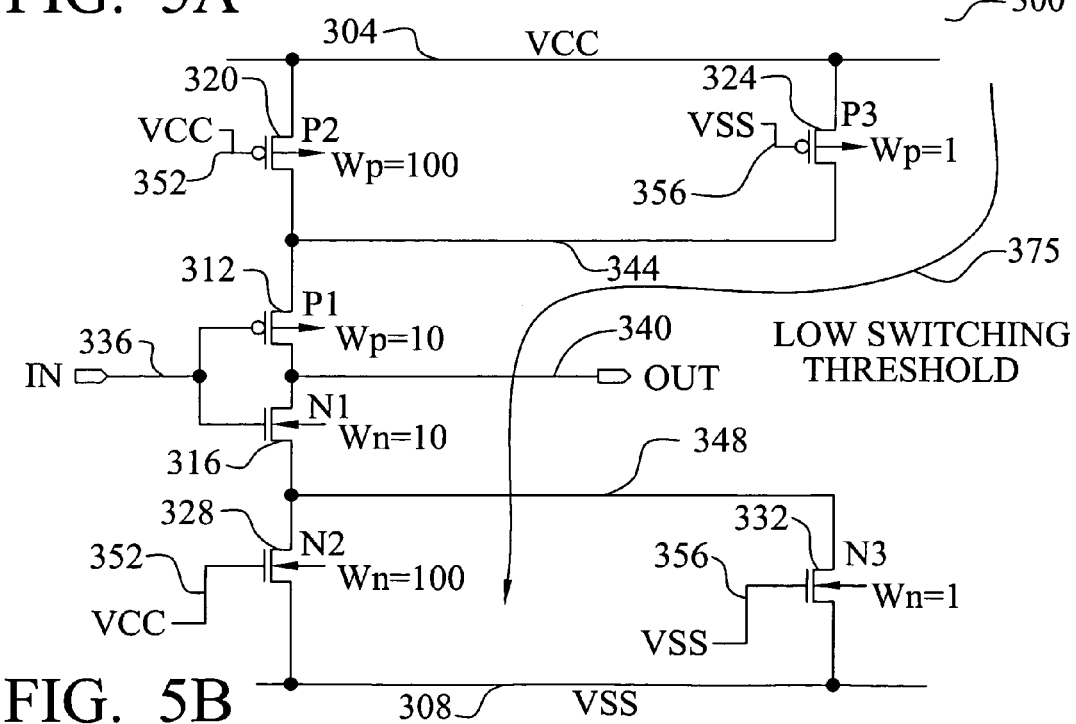

Referring in particular to FIG. 5B, the case where CNTLB 356 is low (VSS) and CNTL 352 is high (VCC) is shown. This condition causes the first p-channel transistor P2 320 to be OFF, the second p-channel transistor P3 324 to be ON, the first n-channel transistor N2 328 to be ON, and the second n-channel transistor N3 332 to be OFF. As a result, current flows 375 from VCC 304 through P3 324, through the inverter P1 312 and N1 316, and through N2 328 to VSS 308. The effective transistor width of the p-channel transistors P1 312 and P3 324 is 1. The effective transistor width of the n-channel transistors N1 316 and N2 328 is 10. Therefore, the inverter buffer is effectively unbalanced towards the N-channel device. The resulting switching threshold is LOW or below the mid-supply.

Figure 6:
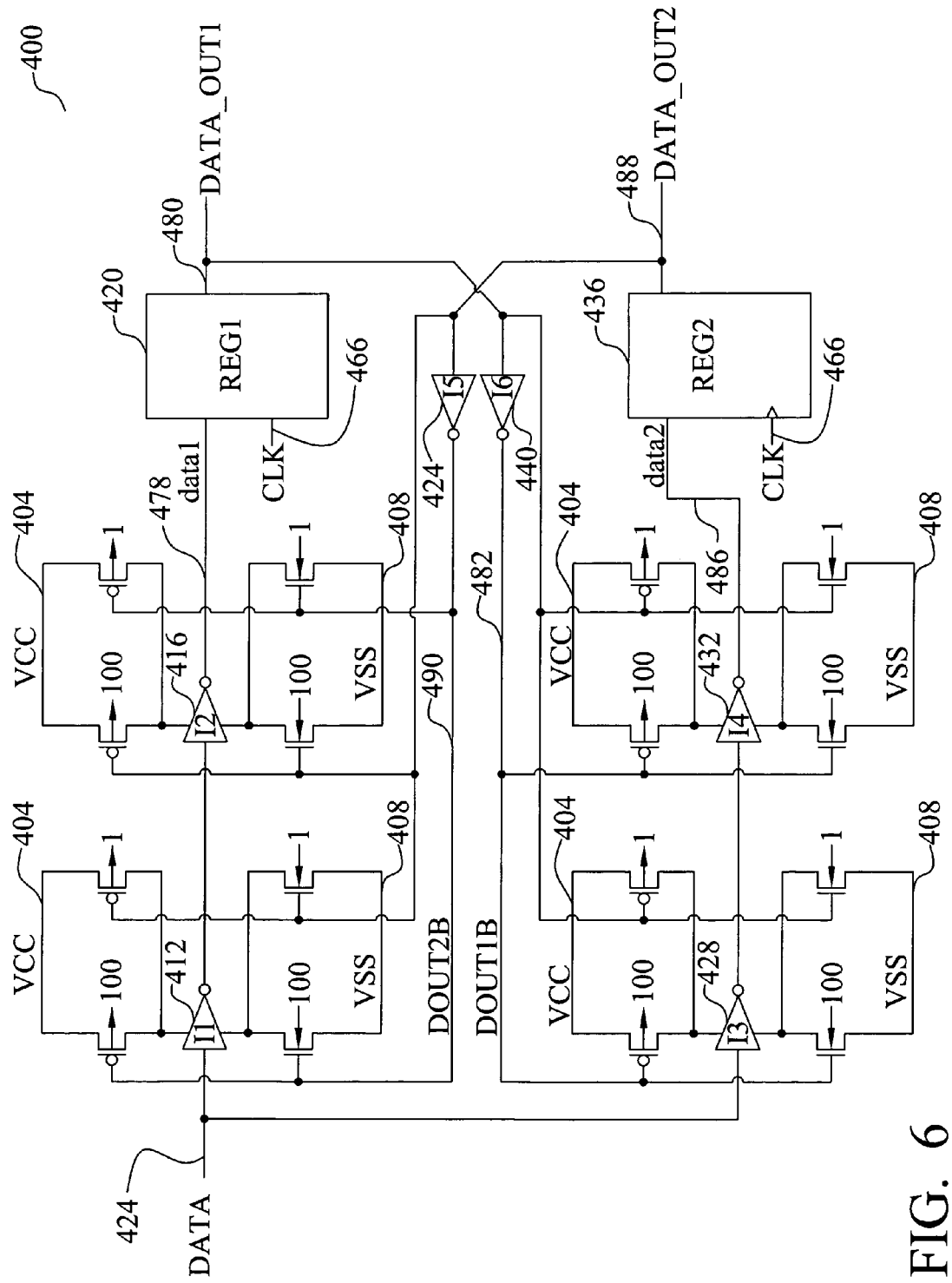
FIG. 6 illustrates the first preferred embodiment of the present invention showing a data path architecture for sampling a digital data signal.

Referring now to FIG. 6, the first preferred embodiment 400 of the present invention is illustrated again in schematic form. Here, the details of the inverter buffers and the relationship between the inverter buffers and the sample outputs are made clear. The DATA input 474 is processed through the top data path comprising two inverters I1 412 and I2 416 to generate data1 478. The DATA input 474 is also processed through the bottom data path comprising two inverters I3 428 and I4 432 to generate data2 486. Each inverter is supplied with VCC 404 by the first and second p-channel transistors and is supplied with VSS 408 by the first and second n-channel transistors to form the adjustable switching threshold inverter buffers as described in FIG. 4. The data1 signal 478 is sampled by the register REG1 420 at the rising edges of the system clock CLK 466 to generate the DATA_OUT1 signal 480. The data2 signal 486 is sampled by the register REG2 436 at the falling edges of the system clock CLK 466 to generate the DATA_OUT2 signal 488.

The DATA_OUT1 signal 480 is connected to an inverter I6 440 to generate an inverted version DOUT1B 482. The DATA_OUT2 signal 488 is connected to an inverter I5 424 to generate an inverted version DOUT2B 490. DATA_OUT1 480 and DOUT1B 482 are connected to the inverting buffers in the data2 486 signal path. DATA_OUT2 488 and DOUT2B 490 are connected to the inverting buffers in the data1 478 signal path. In the data1 signal path, the first inverter buffer, comprising inverter I1 412, has DOUT2B 490 connected to the first n-channel and p-channel transistors and DATA_OUT2 488 connected to the second n-channel and p-channel transistors. For the second stage inverter buffer, comprising I2 416, the DATA_OUT2 and DOUT2B signals are reversed. Similarly, in the data2 signal path, the first inverter buffer, comprising inverter I3 428, has DOUT1B 482 connected to the first n-channel and p-channel transistors and DATA_OUT1 480 connected to the second n-channel and p-channel transistors. For the second stage inverter buffer, comprising I4 432, the DATA_OUT1 and DOUT1B signals are reversed.

The advantages of the present invention may now be summarized. An effective digital sampling circuit is achieved. A method to improve digital sampling performance is achieved. The method dynamically adjusts inverter buffer switching thresholds to thereby improve setup and hold performance of a digital sampling circuit. Setup and hold performance for a digital signal is thereby optimized. A digital sampling circuit with dynamically adjusted setup and hold times is achieved. The circuit optimizes setup and hold times by feeding back sampled data to dynamically adjust inverter buffer switching thresholds.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to sample a digital input signal, said method comprising:
   providing a first digital buffer comprising:
      a first p-channel transistor;
      a first n-channel transistor;

a first pair of p-channel transistors having drains and sources connected together; and a first pair of n-channel transistors having drains and sources connected together wherein said first p-channel transistor, said first n-channel transistor, said first pair of p-channel transistors, and said first pair of n-channel transistors are connected in series between an upper supply voltage and a lower supply voltage, wherein gates of said first p-channel and first n-channel transistor are connected to a same input signal, wherein gates of one said n-channel transistor and of one said p-channel transistor, in each said first pair of p-channel and n-channel transistors, are connected to a first control signal and gates of other said n-channel transistor and of other said p-channel transistor, in each said first pair of p-channel and n-channel transistors, are connected to an inversion of said first control signal;

providing a second digital buffer comprising:

a second p-channel transistor;

a second n-channel transistor;

a second pair of p-channel transistors having drains and sources connected together; and a second pair of n-channel transistors having drains and sources connected together wherein said second p-channel transistor, said second n-channel transistor, said second pair of p-channel transistors, and said second pair of n-channel transistors are connected in series between an upper supply voltage and a lower supply voltage, wherein gates of said second p-channel and second n-channel transistor are connected to the same input signal, wherein gates of one said n-channel transistor and of one said p-channel transistor, in each said second pair of p-channel and n-channel transistors, are connected to a second control signal and gates of other said n-channel transistor and of other said p-channel transistor, in each said second pair of p-channel and n-channel transistors, are connected to an inversion of said second control signal;

sampling a digital input processed through said first digital buffer wherein said sampling is at the rising edge of a system clock;

updating the switching threshold of said second digital buffer;

sampling said digital input processed through said second digital buffer wherein said sampling is at the falling edge of said system clock; and updating the switching threshold of said first digital buffer.

2. The method according to claim 1 wherein said first switching threshold is set to a low level if said second sample is low state and wherein said first switching threshold is set to a high level if said second sample is high state.

3. The method according to claim 1 wherein said second switching threshold is set to a low level if said first sample is low state and wherein said second switching threshold is set to a high level if said first sample is high state.

4. The method according to claim 1 wherein said upper supply voltage is the power supply and said lower supply is the ground reference for an integrated circuit device.

5. The method according to claim 1 wherein the effective widths of each said p-channel transistor in said pair of p-channel transistors are unequal.

6. The method according to claim 1 wherein the effective widths of each said n-channel transistor in said pair of n-channel transistors are unequal.

7. The method according to claim 1 wherein said steps of sampling are performed using flip-flops.

8. A digital sampling device comprising: a first digital buffer having an input and an output and comprising a plurality of series connected, digital inverters each having an adjustable switching threshold; a first p-channel transistor; a first n-channel transistor; a first pair of p-channel transistors having drains and sources connected together; and a first pair of n-channel transistors having drains and sources connected together wherein said first p-channel transistor, said first n-channel transistor, said first pair of p-channel transistors, and said first pair of n-channel transistors are connected in series between an upper supply voltage and a lower supply voltage, wherein gates of said first p-channel and first n-channel transistor are connected to a same input signal, wherein gates of one said n-channel transistor and of one said p-channel transistor, in each said first pair of p-channel and n-channel transistors, are connected to a first control signal and gates of other said n-channel transistor and of other said p-channel transistor, in each said first pair of p-channel and n-channel transistors, are connected to an inversion of said control signal; a first sampling register generating a first sample of said first digital buffer output at rising edges of a system clock; a second digital buffer having an input and an output and comprising: a plurality of series connected, digital inverters each having an adjustable switching threshold wherein said first and second digital buffer inputs are the same signal; a second p-channel transistor; a second n-channel transistor; a second pair of p-channel transistors having drains and sources connected together; and a second pair of n-channel transistors having drains and sources connected together wherein said second p-channel transistor, said second n-channel transistor, said second pair of p-channel transistors, and said second pair of n-channel transistors are connected in series between an upper supply voltage and a lower supply voltage, wherein gates of said second p-channel and second n-channel transistor are connected to the same input signal, wherein gates of one said n-channel transistor and of one said p-channel transistor, in each said second pair of p-channel and n-channel transistors, are connected to a second control signal and gates of other said n-channel transistor and of other said p-channel transistor, in each said second pair of p-channel and n-channel transistors, are connected to an inversion of said second control signal; and a second sampling register generating a second sample of said second digital buffer output at falling edges of said system clock wherein said first digital buffer switching threshold is adjusted based on said second sample and wherein said second digital buffer switching threshold is adjusted based on said first sample.

9. The device according to claim 8 wherein said first switching threshold is set to a low level if said second sample is low state and wherein said first switching threshold is set to a high level if said second sample is high state.

10. The method according to claim 8 wherein said second switching threshold is set to a low level if said first sample is low state and wherein said second switching threshold is set to a high level if said first sample is high state.

11. The device according to claim 8 wherein said upper supply voltage is the power supply and said lower supply is the ground reference for an integrated circuit device.

12. The device according to claim 8 wherein the effective widths of each said p-channel transistor in said pair of p-channel transistors are unequal.

13. The device according to claim 8 wherein the effective widths of each said n-channel transistor in said pair of n-channel transistors are unequal.

14. The device according to claim 8 further comprising:

an inverter to generate said inversion of said first sample from said first sample; and an inverter to generate said inversion of said second sample from said second sample.

15. The device according to claim 8 wherein said sampling registers each comprise flip-flops.

16. A digital sampling device comprising:

a first digital buffer having an input and an output and comprising a plurality of series connected, digital inverters each having an adjustable switching threshold;

a first sampling register generating a first sample of said first digital buffer output at rising edges of a system clock;

a second digital buffer having an input and an output and comprising a plurality of series connected, digital inverters each having an adjustable switching threshold wherein said first and second digital buffer inputs are the same signal and wherein said first and second digital buffers each comprise:

a first p-channel transistor;

a first n-channel transistor;

a pair of p-channel transistors having drains and sources connected together; and a pair of n-channel transistors having drains and sources connected together wherein said first p-channel transistor, said first n-channel transistor, said pair of p-channel transistors, and said pair of n-channel transistors are connected in series between an upper supply voltage and a lower supply voltage, wherein gates of said first p-channel and n-channel transistor are connected to a same input signal, wherein gates of one said n-channel transistor and of one said p-channel transistor, in each said pair of p-channel and n-channel transistors, are connected to a control signal and gates of other said n-channel transistor and of other said p-channel transistor, in each said pair of p-channel and n-channel transistors, are connected to an inversion of said control signal; and a second sampling register generating a second sample of said second digital buffer output at falling edges of said system clock wherein said first digital buffer switching threshold is adjusted based on said second sample and wherein said second digital buffer switching threshold is adjusted based on said first sample.

17. The device according to claim 16 wherein said first switching threshold is set to a low level if said second sample is low state and wherein said first switching threshold is set to a high level if said second sample is high state.

18. The method according to claim 16 wherein said second switching threshold is set to a low level if said first sample is low state and wherein said second switching threshold is set to a high level if said first sample is high state.

19. The device according to claim 16 wherein said upper supply voltage is the power supply and said lower supply is the ground reference for an integrated circuit device.

20. The device according to claim 16 wherein the effective widths of each said p-channel transistor in said pair of p-channel transistors are unequal.

21. The device according to claim 16 wherein the effective widths of each said n-channel transistor in said pair of n-channel transistors are unequal.

22. The device according to claim 16 further comprising:

an inverter to generate said inversion of said first sample from said first sample; and an inverter to generate said inversion of said second sample from said second sample.

23. The device according to claim 16 wherein said sampling registers each comprise flip-flops.

* * * * *